US007746183B2

(12) United States Patent
Kim et al.

(10) Patent No.: US 7,746,183 B2

(45) Date of Patent: Jun. 29, 2010

(54) MEASUREMENT APPARATUS FOR IMPROVING PERFORMANCE OF STANDARD CELL LIBRARY

(75) Inventors: Seong-Heon Kim, Yongin-si (KR); Woo Chol Shin, Suwon-si (KR); Kyeong Soon Cho, Seongnam-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/145,334

(22) Filed: Jun. 24, 2008

(65) Prior Publication Data

US 2009/0002081 A1 Jan. 1, 2009

(30) Foreign Application Priority Data

Jun. 26, 2007 (KR) ..................... 10-2007-0062702

(51) Int. Cl.
*G01R 23/00* (2006.01)

(52) U.S. Cl. .......................... 331/44; 331/57; 324/73.1; 324/763; 324/765; 324/750; 714/724; 714/742

(58) Field of Classification Search ................ 324/73.1, 324/750, 763, 765; 331/44, 57; 714/724, 714/742

See application file for complete search history.

(56) References Cited

U.S. PATENT DOCUMENTS

| | | | | |
|---|---|---|---|---|
| 5,097,208 | A * | 3/1992 | Chiang | 324/537 |
| 5,963,104 | A * | 10/1999 | Buer | 331/78 |
| 6,544,807 | B1 * | 4/2003 | Bach | 438/18 |
| 6,657,504 | B1 * | 12/2003 | Deal et al. | 331/57 |
| 6,933,739 | B1 * | 8/2005 | Rosen | 324/763 |
| 2007/0054649 | A1 * | 3/2007 | Hattori | 455/323 |

* cited by examiner

*Primary Examiner*—Arnold Kinkead
*Assistant Examiner*—Richard Tan
(74) *Attorney, Agent, or Firm*—Sherr & Vaughn, PLLC

(57) ABSTRACT

Disclosed herein is a measurement apparatus for improving performances of standard cells in a standard cell library when verifying performance of the standard cell library through a ring oscillator among various test element groups (TEGs). A built-in circuit is used to measure and verify performance of the standard cell library through a TEG. Therefore, it is possible to effectively improve performances of the standard cells in the standard cell library. Particularly, it is possible to not only remove human errors or internal errors of equipment, but also perform the measurement more readily, rapidly and accurately. Further, it is possible to curtail the use of high-performance equipment or manpower and time required in a measurement process.

19 Claims, 8 Drawing Sheets

MEASUREMENT APPARATUS FOR IMPROVING PERFORMANCE OF STANDARD CELL LIBRARY

The present application claims priority under 35 U.S.C. 119 to Korean Patent Application No. 10-2007-0062702 (filed on Jun. 26, 2007), which is hereby incorporated by reference in its entirety.

BACKGROUND

FIG. 1 is a block diagram showing the configuration of a related ring oscillator. A ring oscillator may be made up of a plurality of delay chains 102 to 103. As shown in FIG. 1, one delay chain 102 has a NAND gate 101, and a chain of inverters IV-1 to IV-N. That is, the delay chain 102 includes a NAND gate 101, a first inverter IV-1 having an input connected to the output of the NAND gate 101, and a second inverter IV-2 having an input connected to the output of the first inverter IV-1. In this manner, the inverters IV-1 to IV-N are sequentially connected up to the Nth inverter IV-N to constitute a chain structure. The output of the Nth inverter IV-N is fed back to an input of the NAND gate 101 at the same time it is externally outputted. A delay chain 103 is additionally provided, which may be of any standard cell type.

The ring oscillator with the above configuration outputs pulses 104A and 104B, each having a certain period. Each output pulse 104A or 104B has a width corresponding to the sum of propagation delay times of standard cells constituting the delay chains 102 to 103 of the ring oscillator. A low to high delay time of each of the standard cells constituting the ring oscillator is obtained by measuring the width of each pulse 104A or 104B through an oscilloscope and multiplying the measured width by a low to high delay time ratio in SPICE.

FIG. 2 is a block diagram showing the configuration of a related digital process monitor circuit. Referring to FIG. 2, the related digital process monitor circuit includes a ring oscillator 201, an asynchronous ripple counter 202, a local counter 203, and a register interface and control unit 205. The register interface and control unit 205 receives an external clock signal CLK, a start command DPM_START and a test cycle period DPM_COUNT_DOWN and outputs a test end signal DPM_DONE, and a count value DPM_COUNT generated by the asynchronous ripple counter 202.

Upon receiving the start command DPM_START, the register interface and control unit 205 outputs, to the ring oscillator 201, an enable signal ENABLE to start the operation of the ring oscillator 201. Upon receiving the enable signal ENABLE, the ring oscillator 201 generates a clock pulse RING_OSC_CLK 204 and transfers it to the asynchronous ripple counter 202 and the register interface and control unit 205. The asynchronous ripple counter 202 counts down in response to the clock pulse RING_OSC_CLK 204.

While the start command DPM_START is applied to the register interface and control unit 205, the local counter 302 receives the test cycle period DPM_COUNT_DOWN from the register interface and control unit 205. After receiving the test cycle period DPM_COUNT_DOWN, the local counter 203 counts down by $2^{DPM\_COUNT\_DOWN}$ (in other words, two raised to the power of the value of DPM_COUNT_DOWN).

When the value of the local counter 203 reaches 0, the local counter 203 transfers the test end signal DPM_DONE to the register interface and control unit 205. Upon receiving the test end signal DPM_DONE, the register interface and control unit 205 stops the entire circuit operation. At this time, the asynchronous ripple counter 202 generates the count value DPM_COUNT and transfers it to the register interface and control unit 205. Then, the register interface and control unit 205 outputs the count value DPM_COUNT transferred from the asynchronous ripple counter 202. Lastly, the asynchronous ripple counter 202 is initialized by a reset signal RESET from the register interface and control unit 205. At this time, the ring oscillator 201 is stopped by a synchronization stop signal SYNC_STOP from the register interface and control unit 205. The period of the clock pulse 204 from the ring oscillator 201 is measured using the count value DPM_COUNT outputted from the register interface and control unit 205.

FIG. 3 is a block diagram showing the configuration of a related apparatus for measuring the speed of a ring oscillator. Referring to FIG. 3, the related ring oscillator speed measurement apparatus includes a ring oscillator 316, a ring counter 307, an enable controller EN 308, a system counter 311, and a count detector 312.

The ring oscillator 316 includes an AND gate 302 and a plurality of inverters 303 to 305 connected in series. The output of the last inverter 305 is positively fed back to the AND gate 302.

The ring oscillator 316 generates a clock pulse RING CLK 306 and outputs it to the ring counter 307. The period of the clock pulse RING CLK 306 is determined depending on a propagation delay time from the AND gate 302 to the last inverter 305. As a result, the period of the clock pulse RING CLK 306 is in proportion to the number of inverters used. The clock pulse RING CLK 306 may have a maximum or minimum frequency under the influence of a process, temperature or voltage variation. The clock pulse RING CLK 306 is inputted to the ring counter 307. The ring counter 307 is a down counter that performs down counting. This ring counter 307 decrements a first preset value at every period of the inputted clock pulse RING CLK 306.

The AND gate 302 of the ring oscillator 316 is concerned in activation of the ring oscillator 316. That is, when the output of the AND gate 302 is "1", the ring oscillator 316 generates the clock pulse 306 continuously. In other words, the ring oscillator 316 provides a rising edge pulse such that the ring counter 307 counts down. When the clock pulse RING CLK 306 is "1", the output of the enable controller EN 308 is "1" and a disable shift value DISABLE-SHIFT is "1", the AND gate 302 outputs "1".

The disable shift value DISABLE-SHIFT is a value inputted from a test device, which acts to block a test vector or logic value for a test while the apparatus of FIG. 3 measures the speed of the ring oscillator 316. Also, the disable shift value DISABLE-SHIFT functions to stop the down counting for a period between a time at which a shift is ended and a time at which the output of the enable controller EN 308 is changed to "1".

The enable controller EN 308 provides an enable signal ENABLE to the system counter 311. Also, this enable signal ENABLE controls activations of the ring oscillator 316 and system counter 311 together with the aforementioned disable shift value DISABLE-SHIFT. When the enable signal ENABLE from the enable controller EN 308 is "0", the oscillation of the ring oscillator 316 and the operation of the system counter 311 are stopped. The enable controller EN 308 is composed of one D flip-flop. The enable controller EN 308 receives the output of the count detector COUNT DET 312 and outputs the enable signal ENABLE to the AND gate 302 and the system counter 311 synchronously with a system clock pulse SYS CLK 310.

The system counter 311 is enabled in response to the enable signal ENABLE from the enable controller EN 308 to decrement a second preset value at every period of the system clock pulse SYS CLK 310 synchronously with the system clock pulse SYS CLK 310. The system counter 311 outputs the decremented second preset value to the count detector COUNT DET 312. The count detector COUNT DET 312 detects the second preset value inputted from the system counter 311.

In detail, the count detector COUNT DET 312 detects when the second preset value inputted from the system counter 311 is "0" or "1", and outputs "0" to the enable controller EN 308 as a result of the detection. Upon receiving "0" from the count detector COUNT DET 312, the enable controller EN 308 outputs the enable signal ENABLE of "0" to the AND gate 302 and the system counter 311 to stop the oscillation of the ring oscillator 316 and the operation of the system counter 311.

When the ring oscillator 316 is stopped as mentioned above, the ring counter 307 outputs a count value 315 obtained by periodically decrementing the first preset value. The count value 315, the second preset value and the period of the system clock pulse SYS CLK 310 are used as factors for measurement of the speed of the ring oscillator 316.

In the above-mentioned related measurement apparatus, in order to calculate a propagation delay time of a standard cell, it is necessary to measure the width of the clock pulse outputted from the ring oscillator. This means that the measurement must be made at the oscilloscope or wafer stage. For this reason, high-performance equipment and much manpower and time are required. Further, the process of measuring the width of the clock pulse outputted from the ring oscillator may be subject to the human error of the measurer or an internal error of the equipment, resulting in difficulties with measurement accuracy.

FIG. 4 is a graph illustrating an error in measurement for calculation of a propagation delay time of a standard cell by the related measurement apparatus. In this drawing, SYS CLK denotes a system clock pulse, EN denotes an enable signal for ON/OFF control of a ring oscillator, RING CLK denotes an output pulse from the ring oscillator, Counter' denotes an output count value from a ring counter having an error, and Counter" denotes a reference count value.

In FIG. 4, because the application time of the second enable signal and the oscillation period of the ring oscillator do not have an equal ratio, a measurement error corresponding to one oscillation period of the ring oscillator may occur even at the application time of the same enable signal. Further, it is difficult to obtain a standard deviation and average of measurement results of performance of the related ring oscillator and a delta value associated with the average. Furthermore, the related measurement apparatus needs a separate register bank or a plurality of flip-flops to set the operating times of a plurality of ring oscillators and set the initial value of a counter for performance measurement, thus increasing the entire chip size.

SUMMARY

Embodiments relate to verifying performance of a standard cell library through a test element group (TEG), and more particularly, to a measurement apparatus for improving performances of standard cells in a standard cell library when verifying performance of the standard cell library through a ring oscillator among various TEGs. Embodiments relate to a measurement apparatus for improving performance of a standard cell library that substantially obviates one or more problems due to limitations and disadvantages of the related art.

Embodiments relate to a measurement apparatus for effectively improving performances of standard cells in a standard cell library by using a built-in circuit for measuring and verifying performance of the standard cell library through a test element group (TEG). Embodiments relate to an apparatus which is implemented with a built-in circuit for measurement of performance of a standard cell library, thereby making it possible to not only remove a human error of a measurer or an internal error of test equipment, but also perform the measurement more readily, rapidly and accurately. Embodiments relate to an apparatus for curtailing the use of high-performance equipment or manpower and time required in a measurement process.

Embodiments relate to a measurement apparatus for improving performance of a standard cell library which includes a plurality of ring oscillator blocks activated in response to an enable signal externally inputted thereto for outputting measurement result values; a decoder for selectively outputting one or more of the measurement result values from the ring oscillator blocks; and a statistics assistor for receiving output values from the decoder for a predetermined period and outputting a maximum value, a minimum value and an average value of the received values.

The measurement apparatus may further include a diagnosis unit for calculating a standard deviation and a delta value between the values received by the statistics assistor and the average value using the values outputted from the statistics assistor, calculating a propagation delay time of each unit cell in each of the ring oscillator blocks, and determining whether an abnormality is present in the standard cell library. When the standard deviation is larger than a predetermined reference value, the diagnosis unit may determine whether the abnormality is present in the standard cell library, based on a count value bypassed by the statistics assistor.

Each of the ring oscillator blocks may include: an enable stable unit for readjusting a period of the enable signal to a period of a system clock pulse and outputting the resulting enable signal; a ring oscillator for generating a pulse with a certain period based on a value of the enable signal outputted from the enable stable unit; a clock on unit for selectively outputting the system clock pulse based on the value of the enable signal outputted from the enable stable unit; a rising counter operating at any one of a rising edge and falling edge of the pulse generated by the ring oscillator; a falling counter operating at any one of the rising edge and falling edge of the pulse generated by the ring oscillator; a REF counter for receiving the system clock pulse outputted from the clock on unit, the REF counter operating at a rising edge of the received system clock pulse; and a captured data storage unit for, when the ring oscillator is stopped based on the value of the enable signal, receiving output values from the rising counter, falling counter and REF counter and storing or outputting the received values as final values.

The ring oscillator may include a NAND gate and a plurality of unit cells connected in series, and the pulse generated by the ring oscillator may be fed back to the NAND gate. The REF counter may count up or count down to measure a time for which the enable signal is applied to the ring oscillator. Each of the rising counter and falling counter may count up or count down to measure the period or half-period of the pulse generated by the ring oscillator.

The enable stable unit may synchronize the value of the outputted enable signal with the system clock pulse such that a width of the system clock pulse outputted from the clock on unit is not smaller than a minimum pulse width recognizable by the REF counter. When the period of the pulse generated by the ring oscillator is measured, the falling counter may count up or count down at the rising edge or falling edge of the generated pulse to reduce a measurement error.

The statistics assistor may ignore output values from the decoder for a specific period and then receive the output values from the decoder for the predetermined period. The statistics assistor may include: a total sum unit for obtaining a total sum of the values received for the predetermined period; and a minimum/maximum value storage unit for separately storing the minimum value and maximum value of the received values.

The measurement apparatus may be built in on a circuit board or test board. It may also be integrated onto a semiconductor chip using a standard cell library formed commonly with other circuits formed on the same wafer or chip. The measurement apparatus may include a first ring oscillator block having a first unit cell type, and a second ring oscillator block having a second unit cell type, with each of the unit cell types belonging to the standard cell library. The measurement apparatus measures propagation delay performance of the first and second unit cell types by measuring the propagation delay performance of the first and second ring oscillator block.

DRAWINGS

Figure 1:
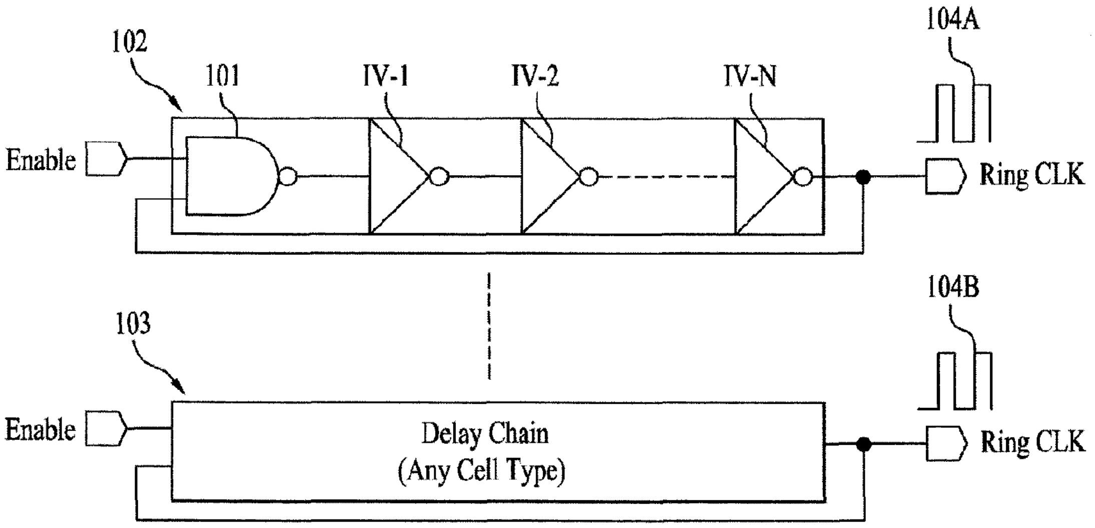
FIG. 1 is a block diagram showing the configuration of a related ring oscillator.
Figure 2:
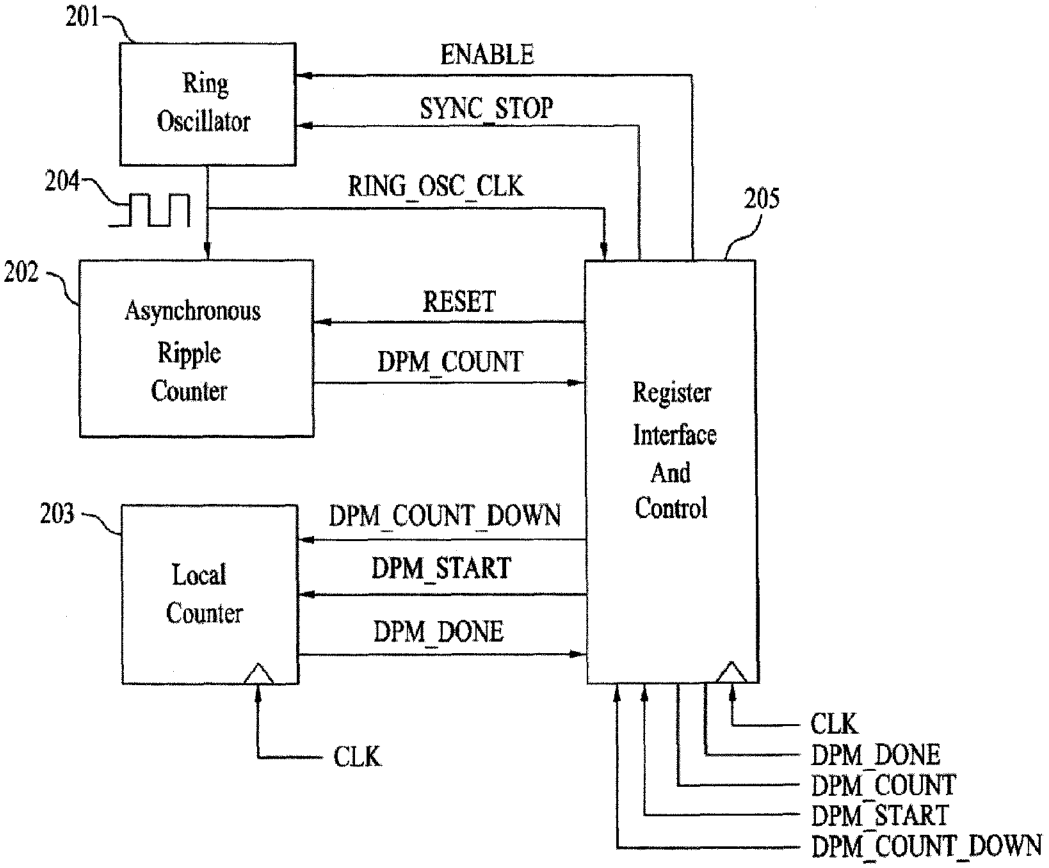
FIG. 2 is a block diagram showing the configuration of a related digital process monitor circuit.
Figure 3:
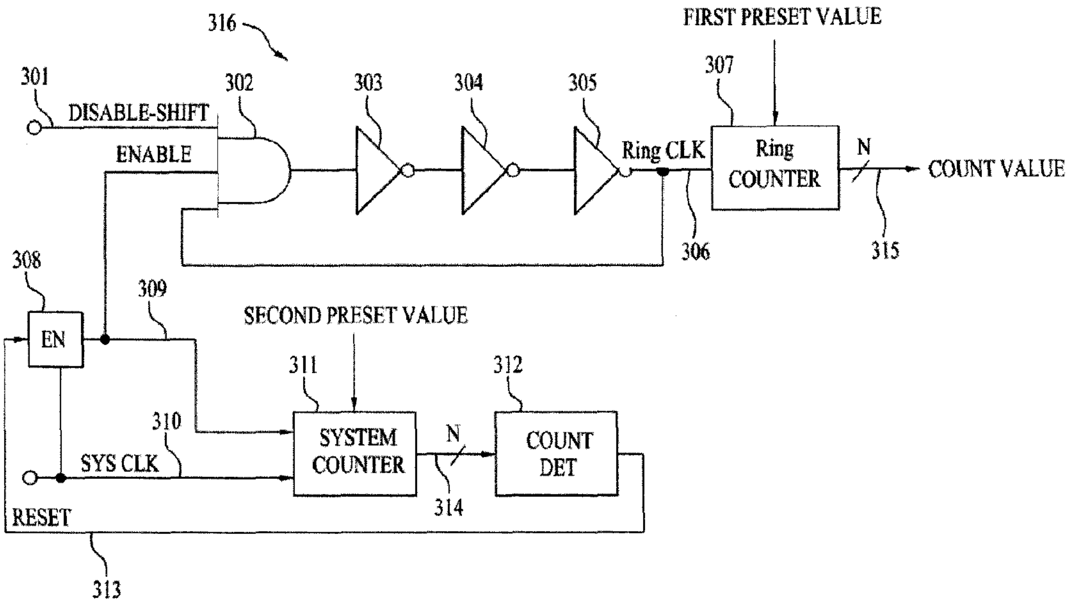
FIG. 3 is a block diagram showing the configuration of a related apparatus for measuring the speed of a ring oscillator.
Figure 4:
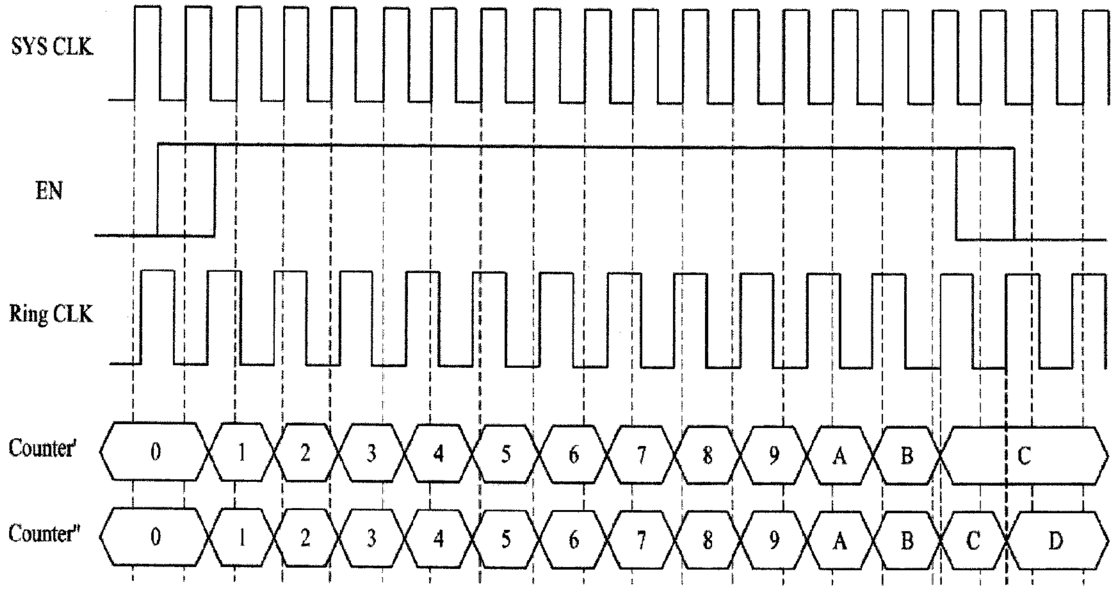
FIG. 4 is a graph illustrating an error in measurement for calculation of a propagation delay time of a standard cell by the related measurement apparatus.
Figure 5:
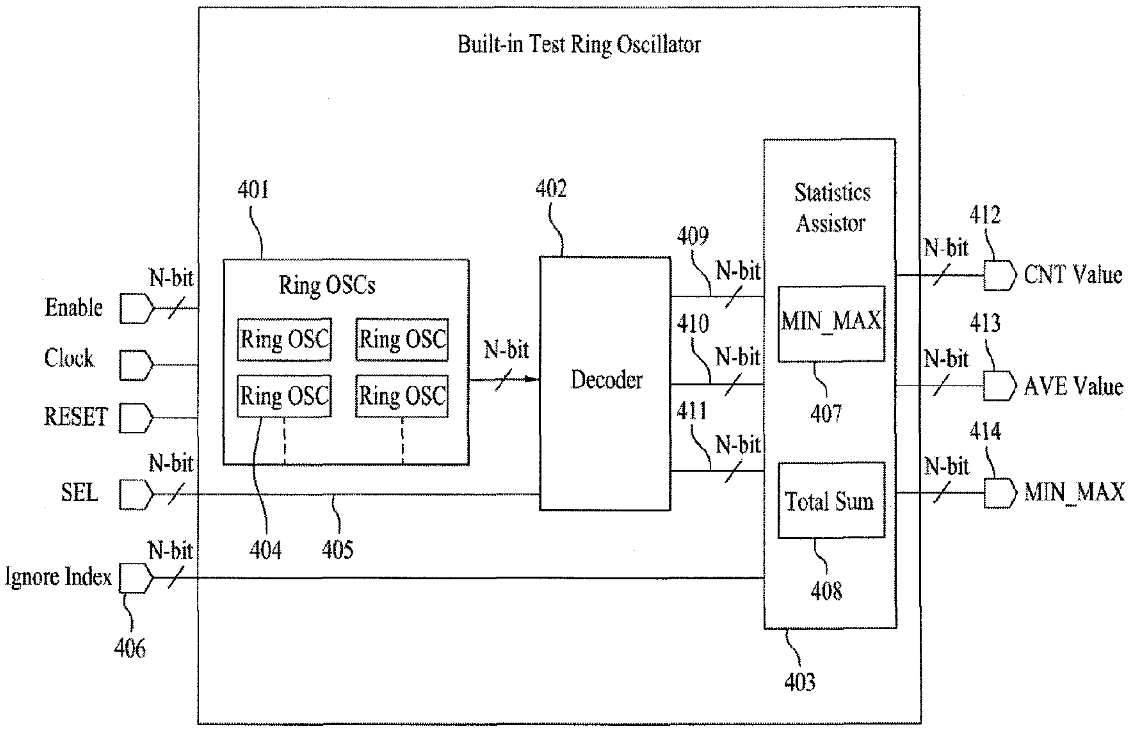

Example FIG. 5 is a block diagram showing the configuration of a built-in apparatus for measurement of the performance of a ring oscillator according to embodiments.

Figure 6:
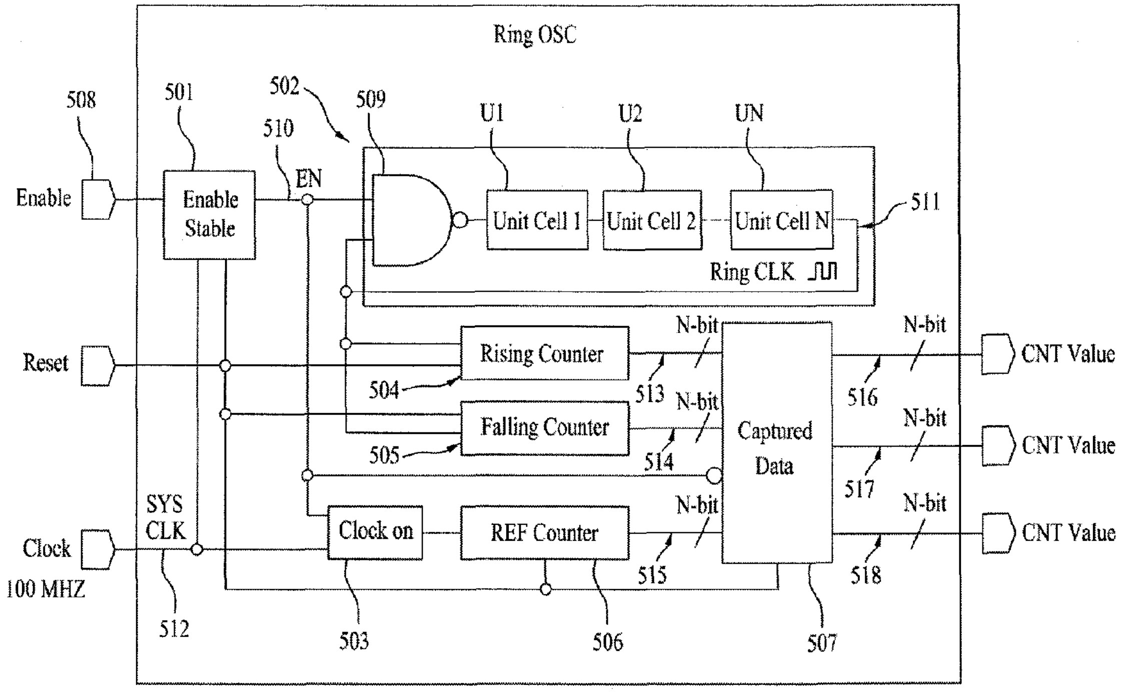

Example FIG. 6 is a block diagram showing the configuration of a ring oscillator block according to embodiments.

Figure 7:
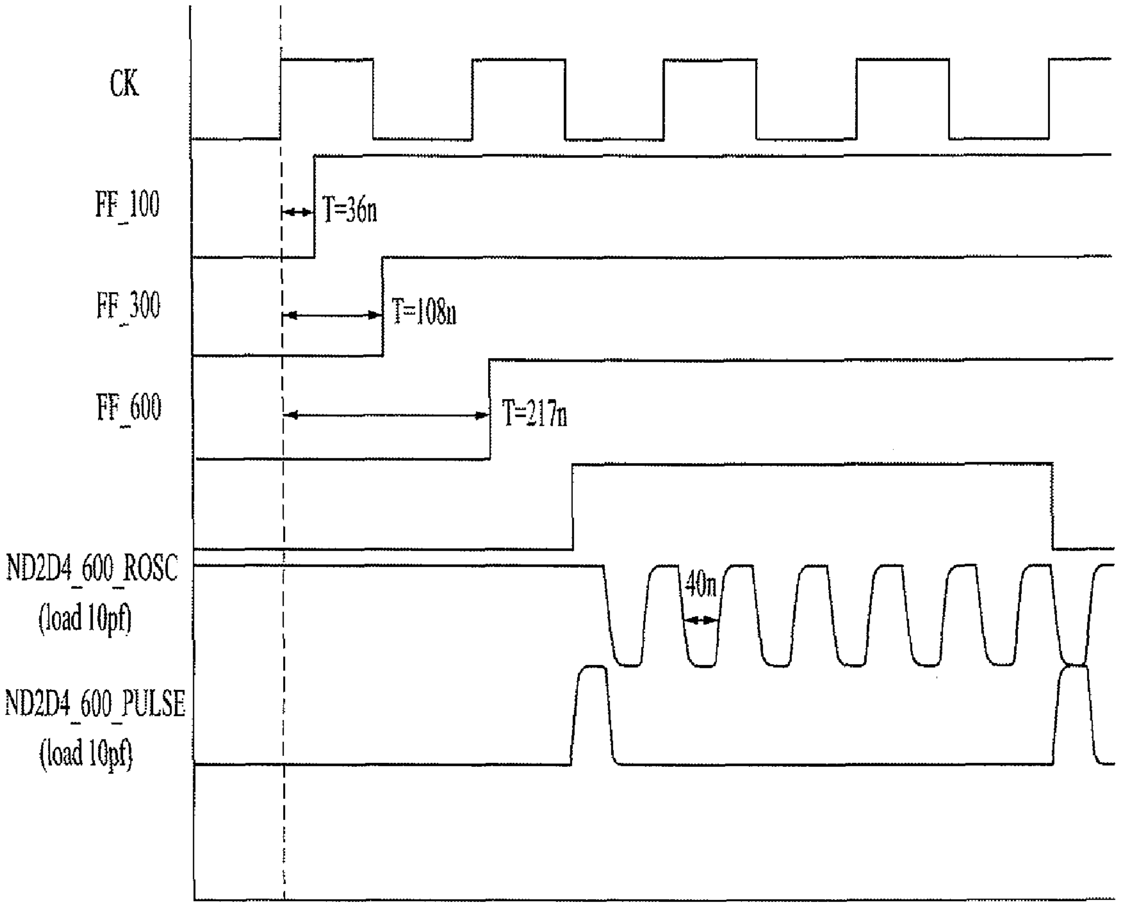

Example FIG. 7 is a graph illustrating the results of a SPICE simulation for determination of the number of unit cells in a ring oscillator, in embodiments.

Figure 8:
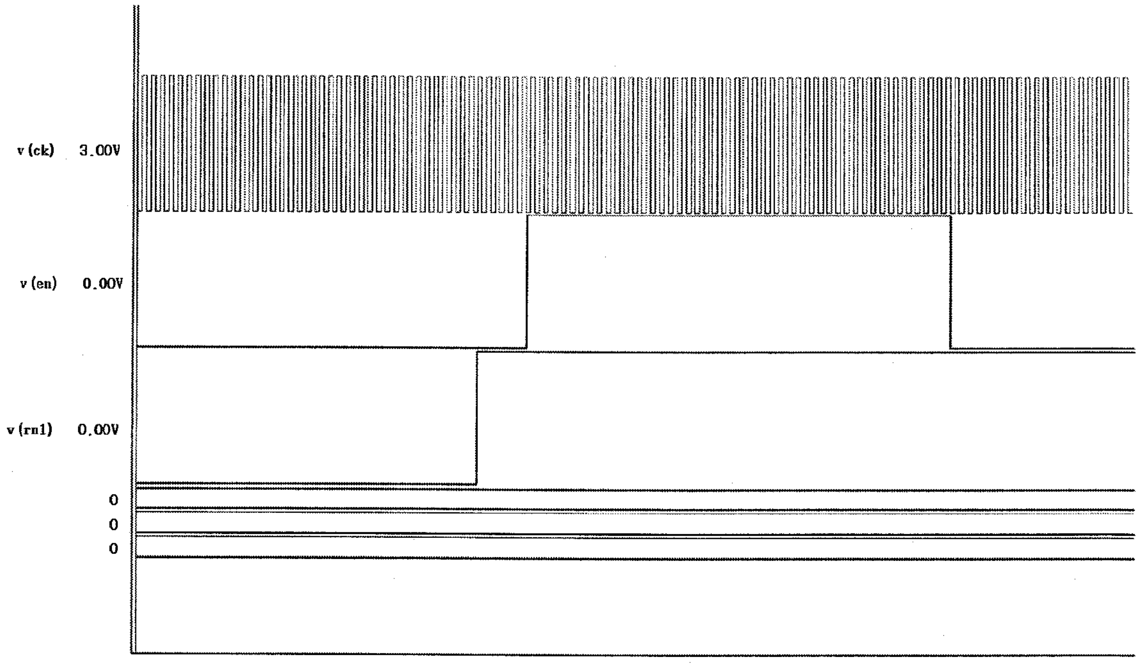

Example FIG. 8 is a graph illustrating the results of a SPICE simulation with an RC parasitic parameter with respect to a ring oscillator, in embodiments.

DESCRIPTION

Example FIG. 5 is a block diagram showing the configuration of a built-in apparatus for measurement of the performance of a ring oscillator according to embodiments. Referring to example FIG. 5, the measurement apparatus according to embodiments is of a built-in type.

The measurement apparatus according to embodiments includes a plurality of ring oscillator blocks 401, a decoder 402, and a statistics assistor 403. The plurality of ring oscillator blocks 401 include ring oscillator blocks 404 corresponding to respective unit cell types. For example, one ring oscillator block 404 corresponding to a certain unit cell type is shown in example FIG. 6.

Example FIG. 6 is a block diagram showing the configuration of a ring oscillator block according to embodiments. The ring oscillator block 404 shown in example FIG. 6 includes an enable stable unit 501, a ring oscillator 502, a clock on unit 503, a rising counter 504, a falling counter 505, a REF counter 506, and a captured data storage unit 507.

The enable stable unit 501 readjusts the period of an enable signal externally inputted thereto to the period of a system clock pulse SYS CLK 512. To this end, the enable stable unit 501 includes one D flip-flop. This D flip-flop operates at a falling edge of the system clock pulse SYS CLK 512.

The ring oscillator 502 includes a NAND gate 509 and a plurality of unit cells U1 to UN connected in series. That is, the unit cells are sequentially connected from the first unit cell U1 to the Nth unit cell UN. The output 511 of the last unit cell, or Nth unit cell UN, is fed back and inputted to the NAND gate 509.

The clock on unit 503 selectively applies the system clock pulse SYS CLK 512 to the REF counter 505 in response to the enable signal outputted from the enable stable unit 501. The rising counter 504 performs up counting or down counting at any one of a rising edge and falling edge of the ring clock pulse Ring CLK 511 which is continuously generated and outputted by the ring oscillator 502. The rising counter 504 may operate at the rising edge.

The falling counter 505 performs up counting or down counting at any one of the rising edge and falling edge of the ring clock pulse Ring CLK 511 which is continuously generated and outputted by the ring oscillator 502. This falling counter 505 is provided to reduce a measurement error when measuring the period of the ring clock pulse Ring CLK 511 generated by the ring oscillator 502. The falling counter 505 may operate at the falling edge. The REF counter 506 operates at a rising edge of the system clock pulse SYS CLK 512. The captured data storage unit 507 stores final count values when the operation of the measurement apparatus according to embodiments is stopped.

In the above configuration, the number of unit cells constituting the ring oscillator 502 is determined based on the SPICE simulation results of example FIG. 7. Example FIG. 7 is a graph illustrating the results of a SPICE simulation for determination of the number of unit cells in a ring oscillator, in embodiments. That is, in the results of example FIG. 7, the one having a certain pulse width is determined to be a unit cell which is to be used.

When the enable signal 510 inputted from the enable stable unit 501 to the NAND gate 509 of the ring oscillator 502 is "1", the ring oscillator 502 generates the ring clock pulse Ring CLK 511, which has a certain period. The period of the ring clock pulse Ring CLK 511 is determined by a propagation delay time from the NAND gate 509 to the last, Nth unit cell UN. Therefore, the period of the ring clock pulse Ring CLK 511 is in proportion to the number of unit cells used. The ring clock pulse Ring CLK 511 may have a maximum or minimum frequency under the influence of a process, temperature or voltage variation.

The decoder 402 selectively outputs one or more of the outputs of the ring oscillator blocks 401 in response to a select signal SEL 405 externally inputted thereto. The statistics assistor 403 includes a minimum/maximum value (Min_Max) storage unit 407 and a total sum unit 408. The outputs of the decoder 402, namely, the measurement result values 409, 410 and 411 of the ring oscillator blocks 401 selected by the select signal SEL 405 are inputted to the statistics assistor 403.

When the measurement for the ring oscillator blocks 401 is carried out a plurality of times, the statistics assistor 403 ignores, based on an ignore index 406 externally inputted thereto, the measurement result values 409, 410 and 411 inputted from the decoder 402 from the first measurement result values 409, 410 and 411 to the Nth measurement result values 409, 410 and 411 indicated by the ignore index 406. Thereafter, when the number of measurement times exceeds N indicated by the ignore index 406, the statistics assistor 403 obtains an average value AVE Value 413 of the measurement result values 409, 410 and 411 inputted from the decoder 402.

To obtain the average value 413, the total sum unit 408 obtains a total sum of the measurement result values 409, 410 and 411 inputted from the decoder 402. Then, a minimum value/maximum value Min_Max, among the outputs of the counters 504, 505 and 506 in example FIG. 6 measured several times, is stored. Then, a standard deviation of the outputs of the statistics assistor 403 is obtained. When the standard deviation is large, a diagnosis is made based on a count value CNT Value 412 bypassed by the statistics assistor 403.

The operation of the measurement apparatus with the above configuration according to embodiments will hereinafter be described in detail. Hereinafter, a case where 48 measurements for performance diagnosis are carried out will be taken as an example.

First, the measurement apparatus according to embodiments is powered on. At this time, the value of the enable signal, among the inputs to the ring oscillator 502 provided in each of the ring oscillator blocks 404 corresponding to respective unit cell types, is unknown. That is, the measurement for performance diagnosis is started in an unknown state. For this reason, in embodiments, in an operation for the measurement, an initialization signal RESET is applied for a sufficient time until the ring oscillator 502 becomes stable (S1). Here, the time for which the initialization signal is applied, namely, the initialization time, is obtained from a ring oscillator output waveform diagram as shown in example FIG. 7 through a gate-level simulation or SPICE simulation. When the ring oscillator 502 becomes stable, the value of the enable signal to be inputted to the ring oscillator block 404 to be measured is changed from "1" to "0" and then applied to the ring oscillator block 404 for a certain time (S2).

The enable stable unit 501 synchronizes the enable signal 508 externally inputted thereto with the system clock pulse SYS CLK 512 (S3). In other words, the enable stable unit 501 outputs the enable signal 510 synchronized with the system clock pulse SYS CLK 512 such that the width of the system clock pulse outputted from the clock on unit 503 is not smaller than a minimum pulse width recognizable by the REF counter 506.

When the output 510 of the enable stable unit 501 is "1", the ring oscillator 502 is activated. The activated ring oscillator 502 continuously generates the ring clock pulse Ring CLK 511 having a certain period (S4). Conversely, when the output 510 of the enable stable unit 501 is "0", the ring oscillator 502 is deactivated.

The deactivated ring oscillator 502 stops the generation of the ring clock pulse Ring CLK 511, which has a certain period (S5). The ring oscillator 502 outputs the generated ring clock pulse Ring CLK 511 to the rising counter 504 and the falling counter 505 (S6). The rising counter 504 operates at the rising edge of the ring clock pulse Ring CLK 511 generated by the ring oscillator 502, and the falling counter 505 operates at the falling edge of the ring clock pulse Ring CLK 511 generated by the ring oscillator 502.

In particular, when the two counters 504 and 505 are activated, they each operate as an up counter or down counter at every period of the inputted ring clock pulse 511. That is, each counter counts up or counts down at every period of the ring clock pulse 511. However, when the two counters 504 and 505 are deactivated, they stop their counting operations (S7). On the other hand, when the output 510 of the enable stable unit 501 is "1", the clock on unit 503 applies the system clock pulse SYS CLK 512 externally inputted thereto to the REF counter 506.

After receiving the system clock pulse SYS CLK 512, the REF counter 506 counts up or counts down at every period of the system clock pulse 512. For example, the REF counter 506 may operate at the rising edge of the system clock pulse SYS CLK 512 (S8). Conversely, when the output 510 of the enable stable unit 501 is "0", the clock on unit 503 inhibits the system clock pulse SYS CLK 512 externally inputted thereto from being applied to the REF counter 506. As a result, the REF counter 506 stops its up counting or down counting operation (S9).

When the output 510 of the enable stable unit 501 is "1", the captured data storage unit 507 does not store the outputs 513, 514 and 515 of the three counters 504, 505 and 506 in operation (S10). However, when the output 510 of the enable stable unit 501 is "0", the three counters 504, 505 and 506 stop their operations, and the captured data storage unit 507 stores the outputs 513, 514 and 515 of the three counters 504, 505 and 506 and, at the same time, outputs them to the decoder 402. That is, when the operation of the ring oscillator block according to embodiments is stopped, the captured data storage unit 507 stores the final count values (S11).

By performing the above steps S1 to S11 until the final count values are generated, the output waveform of the ring oscillator block 404 can be obtained as shown in example FIG. 8. Example FIG. 8 is a graph illustrating the results of a SPICE simulation with an RC parasitic parameter with respect to a ring oscillator, in embodiments.

The decoder 402 receives the results outputted from the plurality of ring oscillator blocks 401 including the ring oscillator block 404. Then, the decoder 402 selectively outputs one or more of the outputs of the ring oscillator blocks 401 in response to the select signal SEL 405 externally inputted thereto. That is, the decoder 402 selectively transfers its outputs 409, 410 and 411 to the statistics assistor 403 in response to the select signal SEL 405 (S12).

As stated previously, the above steps S1 to S12 are repeated, for example, 48 times (S13). The statistics assistor 403 ignores results corresponding to the number of times indicated by the ignore index 406 externally inputted thereto, among the results 409, 410 and 411 outputted from the decoder 402 every time. That is, the statistics assistor 403 ignores Nth results 409, 410 and 411 outputted from the decoder 402, indicated by the ignore index 406, and obtains a total sum of the subsequent results 409, 410 and 411 outputted from the decoder 402 beginning with (N+1)th results. Thus, in this example, the statistics assistor 403 obtains an average value AVE Value 413 of the (N+1)th to 48th output results 409, 410 and 411, namely, measurement result values 409, 410 and 411 after the 48 measurements are performed.

Also, while the decoder 402 outputs the (N+1)th to 48th measurement results 409, 410 and 411, the statistics assistor 403 compares the current outputs of the decoder 402 with the previous outputs and stores a minimum value/maximum value Min_Max 414 as a result of the comparison. In order to store data such as the minimum value/maximum value Min_Max 414, the statistics assistor 403 includes a register bank or a plurality of flip-flops. The register bank or flip-flops may store the total sum of the outputs 409, 410 and 411 of the decoder 402. Of course, the statistics assistor 403 also outputs the stored minimum value/maximum value Min_Max 414 as one of the (N+1)th to 48th measurement results 409, 410 and 411.

Also, in embodiments, a standard deviation is calculated with respect to the average value 413 and minimum value/maximum value Min_Max 414 outputted from the statistics assistor 403. When the calculated standard deviation is larger than a predetermined reference value, a diagnosis is made based on the count value CNT Value 412 bypassed by the statistics assistor 403.

In embodiments, a performance diagnosis is carried out using at least one of the outputs 412, 413 and 414 of the statistics assistor 403. That is, a propagation delay time of each unit cell is calculated using the outputs 412, 413 and 414 of the statistics assistor 403. First, a calculation is made based on Equation 1 with respect to a time En_Time for which the enable signal of "1" is applied to the ring oscillator.

$$En\_\text{Time}=\text{system clock pulse SYS CLK period}\times REF\_TR \quad \text{Equation 1}$$

For example, it is assumed that the system clock pulse period is 10 ns (100 MHz). Here, "REF_TR" is an average output value of the REF counter 506 outputted from the statistics assistor 403. The REF counter 506 performs up counting or down counting to measure the time of application of the enable signal to the ring oscillator.

Then, the number of times ROSC_loop that the output of the measurement result of the ring oscillator is repeated is calculated through the following equation 2.

$$ROSC\_\text{loop}=\text{Fall}\_TR+\text{Rise}\_TR+0.5 \quad \text{Equation 2}$$

Here, "Fall_TR" is an average output value of the falling counter 505 outputted from the statistics assistor 403, and "Rise_TR" is an average output value of the rising counter 504 outputted from the statistics assistor 403. Each of the rising counter 504 and the falling counter 505 counts up or counts down to measure the period or half-period of the pulse generated by the ring oscillator.

Then, the half-period OSC_Half_Period of the ring clock pulse 511 generated by the ring oscillator is calculated through the following equation 3. That is, the half-period OSC_Half_Period of the ring clock pulse 511 is calculated using the results calculated in the above equations 1 and 2.

$$OSC\_\text{Half\_Period}=En\_\text{Time}/ROSC\_\text{loop} \quad \text{Equation 3}$$

Then, a propagation delay time Unit Cell Delay of a unit cell is calculated through the following equation 4.

$$\text{Unit Cell Delay}=OSC\_\text{Half\_Period}/\text{unit cell number}\times 2 \quad \text{Equation 4}$$

The propagation delay time Unit Cell Delay of the unit cell is the sum of a rising delay time and a falling delay time, which is calculated using the result calculated in the above equation 3. The rising delay time and the falling delay time constituting the propagation delay time Unit Cell Delay are calculated as in the equations 5 and 6 below, respectively.

$$tPLH=\text{Unit Cell Delay}\times LH \quad \text{Equation 5}$$

$$tPHL=OSC\_\text{Period}\times HL \quad \text{Equation 6}$$

In the above equation 5, "tPLH" is the falling delay time of the unit cell, and "LH" is a unit cell falling delay time ratio in SPICE simulation results.

In the above equation 6, "tPHL" is the rising delay time of the unit cell, "OSC_Period" is the period of the ring clock pulse 511 calculated from the half-period OSC_Half_Period calculated through the equation 3, and "HL" is a unit cell rising delay time ratio in the SPICE simulation results.

Then, a standard deviation, an average and a delta value associated with the average are obtained from the measurement results 412, 413 and 414 outputted from the statistics assistor 403, and a determination is made based on the obtained standard deviation, average and delta value as to whether the propagation delay time of the unit cell calculated from the above equations is accurate and whether an abnormality is present in the circuit. To this end, the measurement apparatus of embodiments includes a diagnosis unit for obtaining a standard deviation, an average and a delta value associated with the average from the measurement results 412, 413 and 414 from the statistics assistor 403. The diagnosis unit determines, based on the obtained standard deviation, average and delta value, whether the propagation delay time of the unit cell calculated from the above equations is accurate and whether an abnormality is present in the circuit. Therefore, according to embodiments, the diagnosis unit can accurately calculate the propagation delay time of the unit cell, and readily obtain the standard deviation, average and delta value of the performance measurement results of the ring oscillator to determine whether an abnormality is present in the circuit.

Alternatively, the measurement apparatus according to embodiments may be built in on a circuit board or test board. As apparent from the above description, according to embodiments, a built-in circuit is used to evaluate and diagnose performance of a standard cell library. Therefore, it is possible to more readily, rapidly and accurately perform the operations of standard cells in the standard cell library, thereby effectively improving the performance of the standard cell library.

Further, in embodiments, a built-in measurement circuit is used for measurement of performance of a standard cell library, thereby making it possible to eliminate human errors of a measurer or internal errors of test equipment. Further, in embodiments, for performance measurement, separate high-performance equipment or added manpower and time are not required while a built-in measurement circuit is used, resulting in an increase in resource efficiency. Particularly, the use of the built-in measurement circuit shortens time required to measure performance, leading to a reduction in standard cell library development time.

Further, because the application time of an enable signal and the oscillation period of a ring oscillator do not normally have an equal ratio in the related art, a measurement error corresponding to one oscillation period of the ring oscillator occurs. However, in embodiments, the falling counter 505 is further provided to reduce the measurement error to ½. In addition, it is possible to reduce an error in the period of a clock generated by the ring oscillator, thereby supporting more accurate performance measurement. Further, it is possible to readily and selectively measure the performance of ring oscillators of various types.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising:

a plurality of ring oscillator blocks activated in response to an enable signal externally inputted thereto for outputting measurement result values;

a decoder for selectively outputting one or more of the measurement result values from the ring oscillator blocks; and a statistics assistor for receiving output values from the decoder for a predetermined period and outputting a maximum value, a minimum value and an average value from the received values, wherein each of the ring oscillator blocks comprises:

an enable stable unit for readjusting a period of the enable signal to a period of a system clock pulse and outputting the resulting enable signal;

a ring oscillator for generating a pulse with a certain period based on a value of the enable signal outputted from the enable stable unit;

an on-unit clock for selectively outputting the system clock pulse based on the value of the enable signal outputted from the enable stable unit;

a rising counter operating at any one of a rising edge and falling edge of the pulse generated by the ring oscillator;

a falling counter operating at any one of the rising edge and falling edge of the pulse generated by the ring oscillator; and a REF counter for receiving the system clock pulse outputted from the on-unit clock, the REF counter operating at a rising edge of the received system clock pulse.

2. The apparatus of claim 1, comprising a diagnosis unit for calculating a standard deviation and a delta value from the values received by the statistics assistor and the average value using the values outputted from the statistics assistor, calculating a propagation delay time of each unit cell in each of the ring oscillator blocks, and determining whether an abnormality is present in a standard cell library.

3. The apparatus of claim 2, wherein the diagnosis unit, when the standard deviation is larger than a predetermined reference value, determines whether the abnormality is present in the standard cell library, based on a count value bypassed by the statistics assistor.

4. The apparatus of claim 1, wherein each of the ring oscillator blocks comprise a captured data storage unit for, when the ring oscillator is stopped based on the value of the enable signal, receiving output values from the rising counter, falling counter and REF counter and storing or outputting the received values as final values.

5. The apparatus of claim 1, wherein the ring oscillator comprises a NAND gate and a plurality of unit cells connected in series.

6. The apparatus of claim 5, wherein the pulse generated by the ring oscillator is fed back to the NAND gate.

7. The apparatus of claim 1, wherein the REF counter counts up or counts down to measure a time for which the enable signal is applied to the ring oscillator.

8. The apparatus of claim 1, wherein each of the rising counter and falling counter counts up or counts down to measure the period or half-period of the pulse generated by the ring oscillator.

9. The apparatus of claim 1, wherein the enable stable unit synchronizes the value of the outputted enable signal with the system clock pulse such that a width of the system clock pulse outputted from the on-unit clock is not smaller than a minimum pulse width recognizable by the REF counter.

10. The apparatus of claim 1, wherein the falling counter, when the period of the pulse generated by the ring oscillator is measured, counts up or counts down at the rising edge or falling edge of the generated pulse to reduce a measurement error.

11. The apparatus of claim 1, wherein the statistics assistor ignores output values from the decoder for a specific period and then receives the output values from the decoder for the predetermined period.

12. The apparatus of claim 11, wherein the statistics assistor comprises:

a total sum unit for obtaining a total sum of the values received for the predetermined period; and a minimum/maximum value storage unit for separately storing the minimum value and maximum value of the received values.

13. The apparatus of claim 1, wherein the apparatus is a measurement apparatus for improving performance of a standard cell library.

14. The apparatus of claim 13, wherein the measurement apparatus is integrated onto a semiconductor chip using a standard cell library formed commonly with other circuits formed on the same wafer.

15. The apparatus of claim 13, wherein the measurement apparatus is integrated onto a semiconductor chip using a standard cell library formed commonly with other circuits formed on the same chip.

16. The apparatus of claim 13, wherein the measurement apparatus is built in on a circuit board.

17. The apparatus of claim 13, wherein the measurement apparatus is built in on a test board.

18. The apparatus of claim 14, wherein the measurement apparatus includes a first ring oscillator block having a first unit cell type, and a second ring oscillator block having a second unit cell type, each of the unit cell types belonging to the standard cell library.

19. The apparatus of claim 18, wherein the measurement apparatus measures propagation delay performance of the first and second unit cell types by measuring the propagation delay performance of the first and second ring oscillator block.

* * * * *